(12) United States Patent
Yang et al.

(10) Patent No.: US 11,836,027 B2
(45) Date of Patent: Dec. 5, 2023

(54) ENHANCED BATTERY BACKUP UNIT BATTERY MANAGEMENT SYSTEM

(71) Applicant: Baidu USA LLC, Sunnyvale, CA (US)

(72) Inventors: Huawei Yang, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 336 days.

(21) Appl. No.: 16/921,031

(22) Filed: Jul. 6, 2020

(65) Prior Publication Data
US 2022/0004239 A1    Jan. 6, 2022

(51) Int. Cl.
| G06F 1/30 | (2006.01) |
| H05K 7/14 | (2006.01) |
| H02J 7/00 | (2006.01) |
| G05B 19/042 | (2006.01) |
| G01R 31/3842 | (2019.01) |

(52) U.S. Cl.
CPC .......... *G06F 1/30* (2013.01); *G01R 31/3842* (2019.01); *G05B 19/042* (2013.01); *H02J 7/0048* (2020.01); *H02J 7/0063* (2013.01); *H02J 7/00308* (2020.01); *H05K 7/1492* (2013.01); *G05B 2219/25257* (2013.01)

(58) Field of Classification Search
CPC .......... H01M 2010/4271; H02J 7/0016; H02J 7/00302; H02J 7/00304; H02J 7/00308; H02J 7/00309; H02J 7/0047; H02J 7/0048; H02J 7/0063; H02J 2310/16; H02J 2207/20; G06F 1/30; G06F 1/263; G06F 1/28; G01R 31/3842; G01R 31/364; G01R 31/382; G01R 31/392; G01R 31/396; G05B 19/042; G05B 2219/25257; H05K 7/1492; Y02T 10/70
See application file for complete search history.

(56) References Cited

U.S. PATENT DOCUMENTS

| 11,360,153 | B1* | 6/2022 | Wang | G01R 31/396 |
| 2006/0152194 | A1* | 7/2006 | Wang | H02J 7/0071 |
| | | | | 320/121 |
| 2007/0210751 | A1* | 9/2007 | Wang | H02J 7/0013 |
| | | | | 320/116 |
| 2010/0072947 | A1* | 3/2010 | Chan | H02J 7/0016 |
| | | | | 320/134 |
| 2010/0253285 | A1* | 10/2010 | Takahashi | H02J 7/00038 |
| | | | | 320/134 |
| 2013/0169038 | A1* | 7/2013 | King | H02J 7/0031 |
| | | | | 307/66 |
| 2014/0157008 | A1* | 6/2014 | Ammu | H05K 7/1492 |
| | | | | 713/300 |
| 2017/0265325 | A1* | 9/2017 | Klikic | H05K 7/1489 |

(Continued)

*Primary Examiner* — Danny Chan
(74) *Attorney, Agent, or Firm* — WOMBLE BOND DICKINSON (US) LLP (57) ABSTRACT

Embodiments are disclosed of a battery management system (BMS). The BMS includes a pair of back-to-back transistors configured to selectively discharge battery cells of a battery pack; a high-side driver configured to control operation of the pair of back-to-back transistors; an analog front end (AFE) circuit configured to monitor a voltage of each cell within the battery pack; and a micro controller unit (MCU) configured to control and monitor the AFE circuit and provide over-voltage protection to the pair of back-to-back transistors.

18 Claims, 5 Drawing Sheets

(56) References Cited

U.S. PATENT DOCUMENTS

| | | | |
|---|---|---|---|
| 2018/0062415 A1* | 3/2018 | Chen | H02J 7/0047 |
| 2018/0139655 A1* | 5/2018 | Hsu | H04W 24/04 |
| 2019/0288532 A1* | 9/2019 | Mattos | H02J 7/0034 |
| 2020/0161877 A1* | 5/2020 | Zhang | H02J 7/0047 |

* cited by examiner

ENHANCED BATTERY BACKUP UNIT BATTERY MANAGEMENT SYSTEM

TECHNICAL FIELD

The disclosed embodiments relate generally to battery energy storage and in particular, but not exclusively, to an enhanced battery backup unit (BBU) battery management system (BMS) with charging/discharging converters.

BACKGROUND

Battery energy storage is a significantly important energy storage method for many applications, such as electric vehicles, consumer electronics, micro-grids, solar and wind power, and data center backup units. Battery cells provide essential energy to support applications as either a primary source of power or as a backup when the main source is unavailable. Thus, the reliability of battery energy storage is highly important to ensure power availability and functionality.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of a design of a battery management system (BMS), as well as charging/discharging converters with suggested components. The BMS can be used to manage a Li-ion battery system used as energy storage. In some embodiments, the BMS can be adopted in a data center Battery Backup Unit (BBU), electrical bike, or other electrical equipment that can adopt Li-ion battery systems as energy storage.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

In one aspect, a battery management system is disclosed. The system includes a pair of back-to-back transistors configured to selectively discharge battery cells of a battery pack. The system also includes a high-side driver configured to control operation of the pair of back-to-back transistors. The system also includes an analog front end (AFE) circuit configured to monitor a voltage of each cell within the battery pack. The system also includes a micro controller unit (MCU) configured to control and monitor the AFE circuit and provide over-voltage protection to the pair of back-to-back transistors. In one embodiment, the system also includes a multiphase converter connected with the pair of back-to-back transistors and configured to convert voltage from the battery pack. In one embodiment, the system also includes an over-voltage protection circuit connected with the battery pack and configured to monitor the battery cells of the battery pack. In one embodiment, the system also includes a hot-swap circuit connected with the multiphase converter. In one embodiment, the system also includes two or more multiphase converters connected in parallel. In one embodiment, the system also includes a first auxiliary power source connected with the battery pack and a second auxiliary power source connected with the multiphase converter. In one embodiment, the first auxiliary power source provides power to the system during discharge of the battery pack, and the second auxiliary power source provides power to the system during standby mode. In one embodiment, the system also includes a fuel gauge connected with the battery pack and a sensing resistor and configured to measure a current of the battery pack.

According to another aspect, an electronic rack is disclosed. The rack includes a stack of server chassis, each server chassis including one or more servers. The rack also includes a power supply coupled to the server chassis to provide power to the servers. The rack also includes a battery backup unit (BBU) having a number of battery cell packages and each battery cell package containing one or more battery cells, wherein the BBU is configured to provide power to the servers when the power supply is unavailable. The rack also includes a battery management system (BMS) connected between the power supply or the servers. The BMS includes a pair of back-to-back transistors configured to selectively discharge the plurality of battery cells of the BBU, a high-side driver configured to control operation of the pair of back-to-back transistors, an analog front end (AFE) circuit configured to monitor a voltage of each cell within the BBU, and a micro controller unit (MCU) configured to control and monitor the AFE circuit and provide over-voltage protection to the pair of back-to-back transistors.

In some embodiments, the BMS also includes a multiphase converter connected with the pair of back-to-back transistors and configured to convert voltage from the BBU. In some embodiments, the BMS also includes an over-voltage protection circuit connected with the BBU and configured to monitor the battery cells of the BBU. In some embodiments, the BMS also includes a hot-swap circuit connected with the multiphase converter. In some embodiments, the BMS also includes two or more multiphase converters connected in parallel. In some embodiments, the BMS also includes a first auxiliary power source connected with the BBU and a second auxiliary power source connected with the multiphase converter. In some embodiments, the first auxiliary power source provides power to the system during discharge of the BBU, and the second auxiliary power source provides power to the system during standby mode. In some embodiments, the BMS also includes a fuel gauge connected with the BBU and a sensing resistor and configured to measure a current of the BBU.

According to another aspect, a method of managing a battery pack is disclosed. The method includes monitoring a voltage of each cell within a battery pack using an analog front end (AFE) circuit within a battery management system (BMS); controlling a pair of back-to-back transistors within the BMS to selectively discharge cells within the battery pack; and controlling and monitoring the AFE circuit using a micro controller unit (MCU) within the BMS, wherein the MCU provides over-voltage protection to the pair of back-to-back transistors. In some embodiments, the method also includes providing power to the BMS during discharge of the battery pack using a first auxiliary power source, and providing power to the BMS during standby mode using a second auxiliary power source. In some embodiments, the method also includes converting voltage from the battery pack using a multiphase converter. In some embodiments, the method also includes measuring battery current of the battery pack using a fuel gauge connected with the battery pack and the AFE circuit.

The present disclosure provides for a BMS design that can be applied to various Li-ion battery packages. In some embodiments, the BMS covers monitoring, protection, and control functionalities. For example, the BMS can monitor the voltage, current, cell and package temperature, state of charge (SOC), and state of health (SOH) of the battery packages. Based on the monitoring parameters, the BMS can include the over voltage, over current, over temperature, under voltage protections with cell balancing, and charging/discharging controls, in some embodiments.

The proposed BMS can be used for various types of battery packages. Based on the package voltage range, different chips may be used. In some embodiments, the BMS can include a redundant auxiliary power, which increases its resiliency when the external power is lost. The BMS can also include an independent analog over voltage protection, besides the digital control, in case the micro controller unit (MCU) is down. In some embodiments, the BMS can also include a hot-swap circuit for BBU applications; however, this is optional since the battery is not inserted or pulled out during discharge. Multiple converters can be connected in parallel, in some embodiments, for high power applications. In the embodiment illustrated below in FIG. 1, only one converter is shown although the converter itself can be optional and multiple converters can be used. For battery applications, the design disclosed herein can be implemented at a unit level in a rack, or at a battery or fuel cell rack.

In one embodiment, a battery pack is connected through back to back switches. It is then connected to a multiphase 4-switch buck-boost converter for converting voltages. The converter is then connected to a hot-swap circuit for hot swapping functionality. Then the hot-swap circuit is connected to a fuse, then to the bus-bar connection. A high current, low temperature coefficient resistor can be used as a sensing resistor. Two Aux power supplies are connected at the battery terminal and the bus-bar terminal, respectively, for redundancy.

Figure 1:
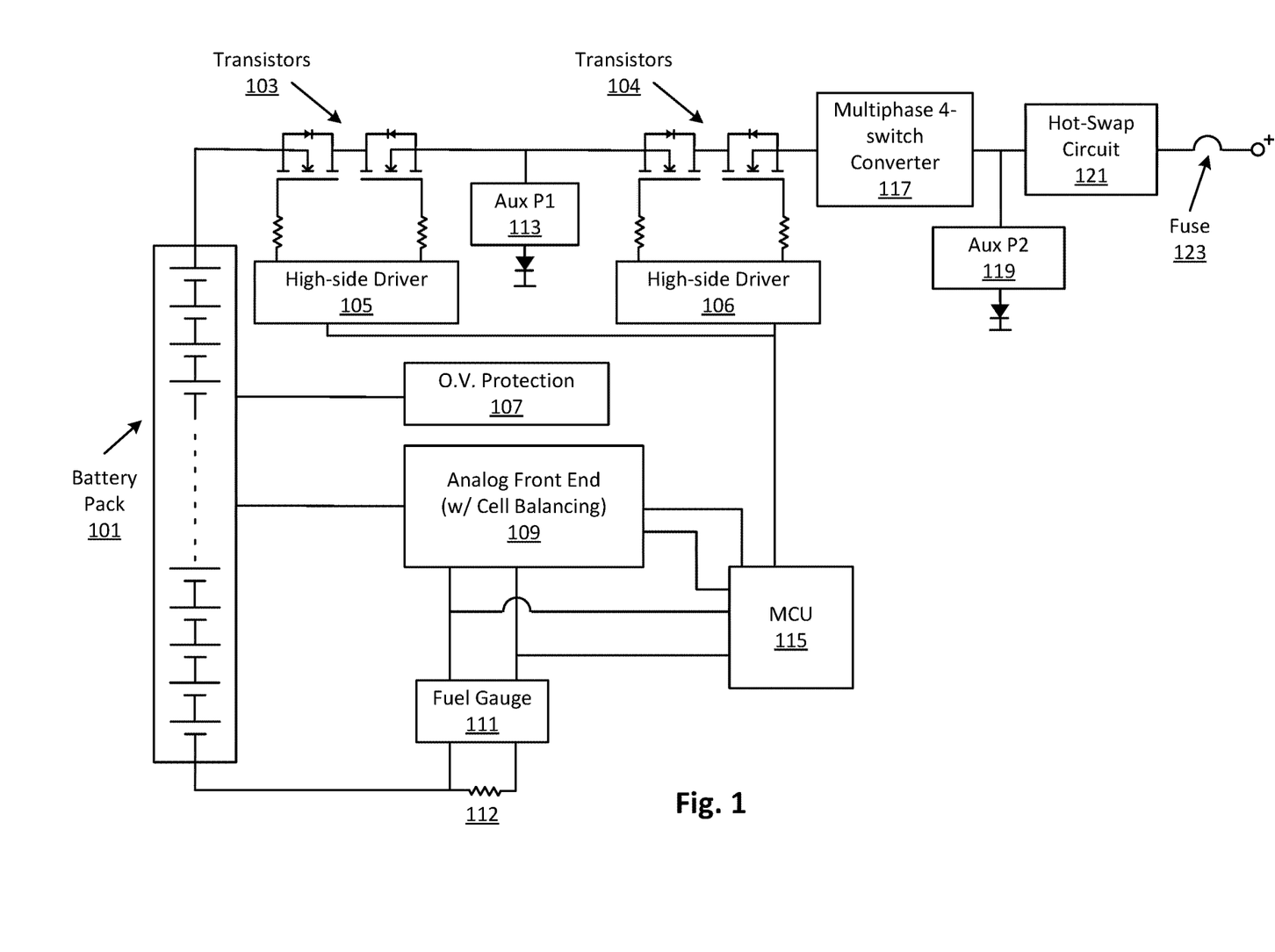
FIG. 1 is a circuit diagram for a battery management system connected to a battery pack and a multiphase converter, according to one embodiment of the disclosure.

FIG. 1 is a circuit diagram for a battery management system connected to a battery pack 101 and a multiphase converter 117, according to one embodiment of the disclosure. In this embodiment, the battery pack 101 is connected to a number of circuits, including an analog front end (AFE) 109, over voltage protection circuit 107, and a pair of back-to-back transistors 103 which are in connection with a high-side driver 105. In some embodiments, a second pair of back-to-back transistors 104 are connected with a second high-side driver 106, and a first auxiliary power Aux P1 113 is located between the sets of back-to-back transistors.

In some embodiments, two sets of back-to-back transistors on both sides of the first auxiliary power Aux P1 113 help prevent a short circuit if only one pair is present and shorted. In such an embodiment, the first auxiliary power Aux P1 113 is located between two sets of transistors 103, 104 such that when a second auxiliary power Aux P2 119 is off (power from bus-bar is down), both 103 and 104 are conducting while the first auxiliary power Aux P1 113 is providing auxiliary power for controllers and other rails. If battery power is cut off and no power from the bus-bar is provided, the two sets of transistors 103, 104 can be alternated to provide power to the first auxiliary power Aux P1 113 such that controllers and other auxiliary functions can still be powered for monitoring and communication purposes.

In the embodiment of FIG. 1, the AFE 109 is a circuit that includes major monitoring circuitry with an ADC and (optionally) a cell balancing circuit. As an example, if TI BQ76940 is selected in one design, it can support 9~15 series connected battery cells, which is suitable in BBU design for data centers. The AFE 109 can include individual ADC for voltage monitoring for each cell. It may also have cell balancing circuit for each series of cells. The AFE 109 is connected to a pairing MCU 115, in this embodiment, through I2C communication and I/Os.

In the embodiment shown in FIG. 1, a fuel gauge 111 is connected to a sensing resistor 112 to measure the battery current. The reading from the fuel gauge 111 is then sent to the MCU 115 through I2C communication. The AFE 109 can be equipped with the fuel gauge 111 for monitoring purposes. A separate connection of direct reading to MCU 115 can be used for fast response for control and protection purposes. The fuel gauge 111 is optional, in some embodiments, since the MCU 115 can have its own algorithm and I/O for sensing.

An optional over voltage protection circuit 107 can be implemented, in some embodiments. The over voltage protection circuit 107 can be used to monitor each set of battery cells (for instance, 2 to 5 cells in series) to send an analog signal to a corresponding switch to open the circuit if over voltage condition is reached. If opted in, TI BQ7718 can be selected. A Self Control protector (SCP) can also be added as an extra protection, such as SFM-50120.

In this embodiment, a high-side driver 105 is connected to the pair of transistors 103 to drive the back-to-back MOSFETs. In one example embodiment, a BQ 76200 driver can be used, but other similar drivers can also be used, such as LTC1154 or others. The switching signal is controlled by MCU 115 through I/O.

The MCU 115 is paired with the AFE 109, in this embodiment, to handle control, protection, and monitoring processing. The MCU 115 also handles all the communication within the system. A separate MCU may be used for controlling a multiphase converter 117, which is omitted here since it should be may to converter 117 itself as a group. In one embodiment, the battery pack 101 is connected to the multiphase converter 117 (such as a multiphase 4-switch buck-boost converter) through back-to-back transistors 103 for converting voltages. The converter 117 can be connected to a hot-swap circuit 121, which is in turn connected to a fuse 123, then a bus-bar connection. In one embodiment, the hot-swap circuit 121 is optional configured to handle hot swap (e.g., insertion and removal during operations) of the battery cells, i.e., the inrush current or over-voltage incurred due to the hot insertion or removal.

Two auxiliary power supplies Aux P1 113 and AUX P2 119 can be connected at the battery terminal and the bus-bar terminal, respectively, to provide redundancy. The auxiliary power can be provided from either the battery, at Aux P1 113 or bus-bar at Aux P2 119, through corresponding circuits. The converter 117 can be used to convert the battery or bus-bar voltage down to the desired auxiliary voltage, such as 5V or 3.3V. Isolation is recommended. For instance, LM5164 with TLV70433 can be deployed for 3.3V application while TLV70450 with isolated converter can be used for 5V rail for communication applications. In this example embodiment, Aux P1 113 can provide power to the system during discharge of the battery pack 101, while Aux P2 119 can provide power to the system during standby or sleep mode.

In some embodiments, the BMS disclosed in FIG. 1 can be integrated into battery energy storage in various scenarios, including but not limited to, at the data center rack level with single or multiple DC buses, data center UPS battery room, electrical vehicles (including hybrid), consumer electronics, and medical devices. This BMS can also be integrated into servers or edge computing devices. In some embodiments, an extra switch can be added in series with the fuse 123 for extra protection, and can be controlled by either the MCU 115 or the over voltage protection circuit 107. In some embodiments, the multiphase 4-switch converter 117 can be replaced by a charging and discharging converter with or without isolation.

Figure 2:
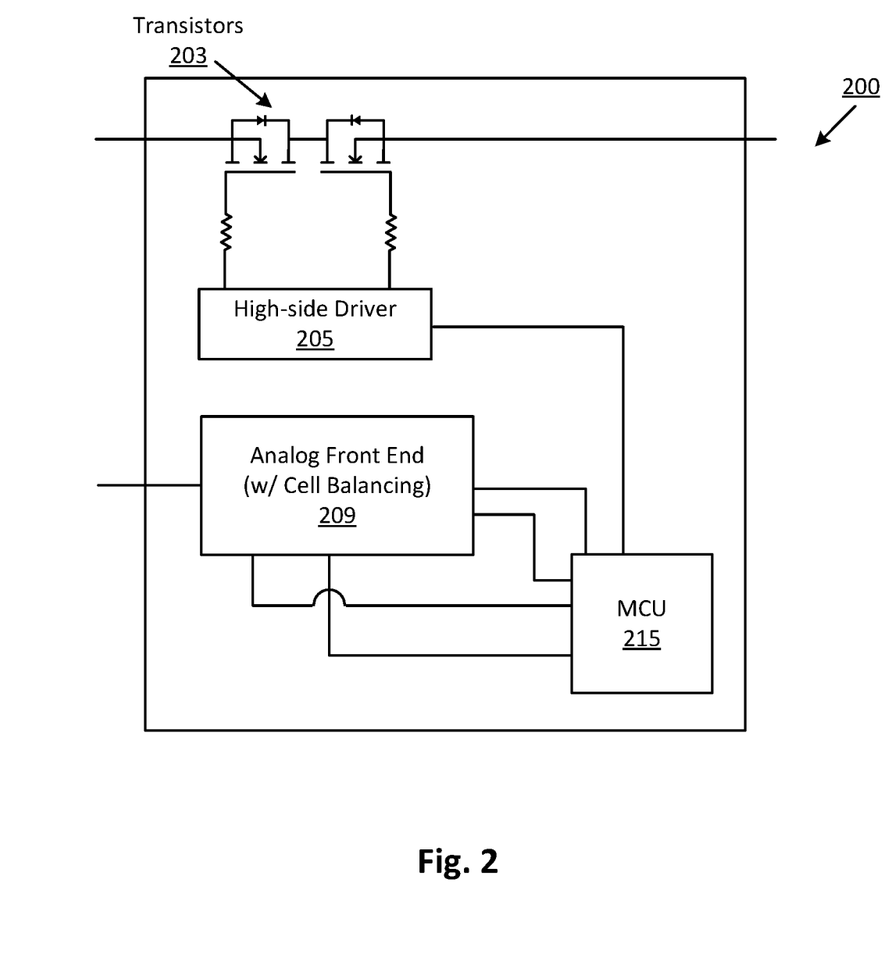
FIG. 2 is circuit diagram for a simplified battery management system, according to one embodiment of the disclosure.

FIG. 2 is circuit diagram for a simplified BMS 200, according to one embodiment of the disclosure. In this embodiment, the BMS 200 includes an AFE 209 in connection with a MCU 215, as well as a high-side driver 205 that is in connection with the MCU 215 and a pair of back-to-back transistors 203. The BMS 200 includes connections so that the transistors 203 can be connected to a battery pack and a converter, as shown in FIG. 1, and so that the AFE 209 can be connected to the battery pack as well. In this embodiment, the AFE 209 can include an ADC and (optionally) a cell balancing circuit, as discussed above. The AFE 209 is connected to a MCU 215, in this embodiment, through I2C communication and I/Os. In this embodiment, a high-side driver 205 is connected to the pair of back-to-back transistors 203 to provide control of the MOSFETs. The switching signal can be controlled by the MCU 215 through I/O.

Figure 3:
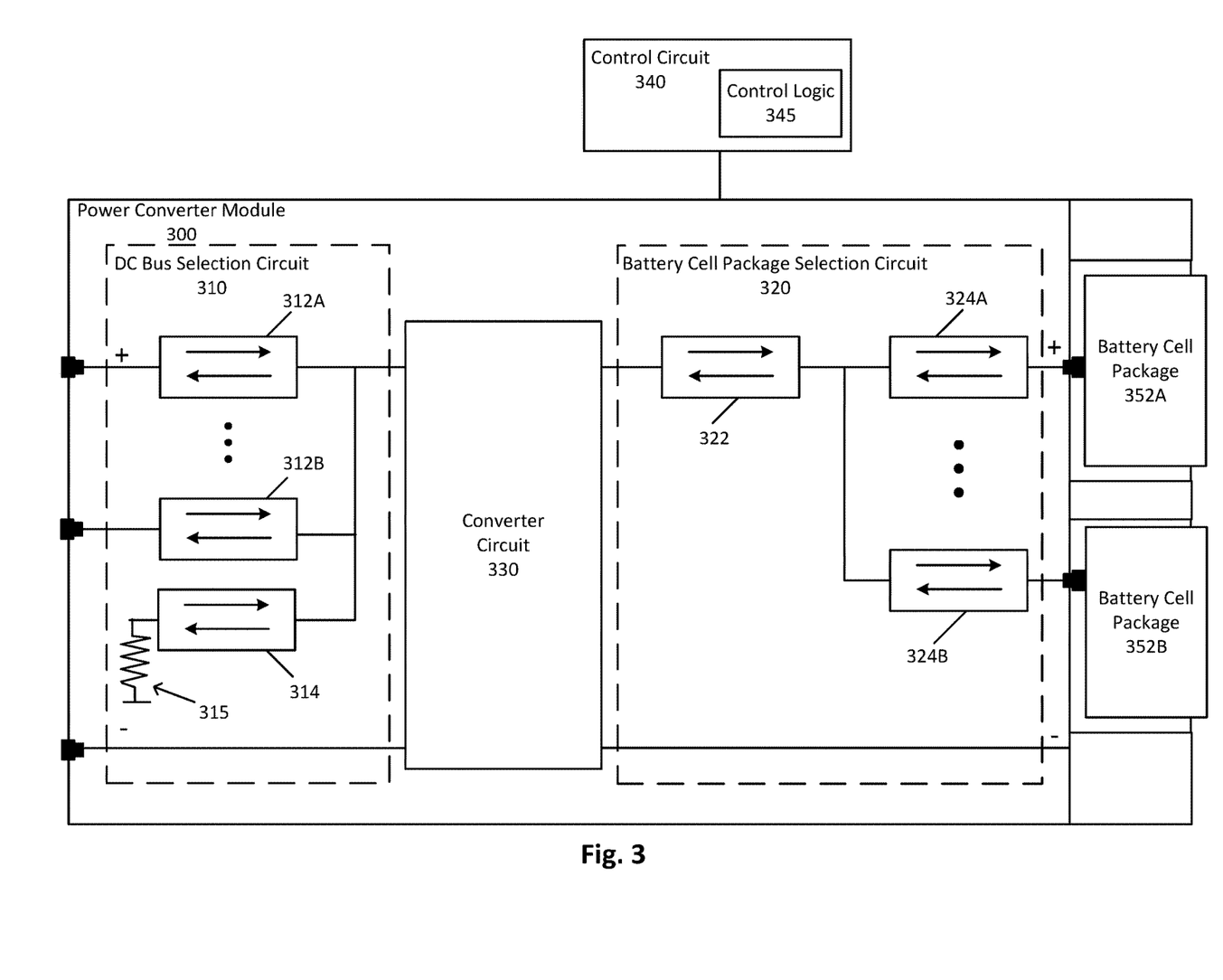
FIG. 3 illustrates an embodiment of a power converter module for bidirectional charging and discharging of multiple parallel battery cells, according to one embodiment of the disclosure.

FIG. 3 illustrates an embodiment of a power converter module 300 for bidirectional charging and discharging of multiple parallel battery cells. In some embodiments, the power converter module 300 illustrated in FIG. 3 can be implemented for the converter 117 shown in FIG. 1. The power converter module 300 may include a DC Bus selection circuit 310, a battery cell selection circuit 320 and one or more converter circuits 330 connected between the DC bus selection circuit 310 and the battery cell selection circuit 320. The DC bus selection circuit 310 may include a set of one or more bidirectional switches or switching circuits 312A-B that are connected in parallel and that are each connected to a separate DC bus, or other external connection such as an external load or an external power supply. Bidirectional switches 312A-B may be used to select one or more DC buses or external connection for either charging or discharging of battery cell packages 352A-B. That is each of the switches 312A-312B can be individually switched between an external load (e.g., a server of an electronic rack) and/or a power supply.

Additionally, the DC bus selection circuit 310 may include one or more bidirectional switches 314 connected in parallel with bidirectional switches 312A-B. Bidirectional switch 314 may be connected to an internal load 315, such as a resistor or other electrical component/circuit. Bidirectional switch 314 may be used to select a low power self-inspection mode in which aspects of the power converter module 300 are monitored while one or more battery cells are discharged through the internal load 315. It should be noted that any number of bidirectional switches may be included in parallel with 312A-B to provide any number of external connections, within the dimensions of the power converter module 300.

The battery cell selection circuit 320 may include a main bidirectional switch 322 connected in series with a set of one or more bidirectional switches or switching circuits 324A-B arranged in parallel. The main bidirectional switch 322 may be used to switch between battery cell package balancing mode and other modes. Bidirectional switches 324A-B may each be connected to a separate battery cell package (e.g., battery cell packages 352A-B as illustrated). The bidirectional switches 324A-B may be used to select one or more battery cell packages 352A-B to charge, discharge, or balance. It should be noted that any number of bidirectional switches may be included in parallel with 322A-B to provide any number of battery cell package connections, within the dimensions of the power converter module 300. The converter circuit 330 may be any type of converter, such as a four-switch buck-boost type converter or other DC-DC converter. In one embodiment, the converter circuit 330 can include multiple converters coupled in parallel to adjust to DC bus power requirements.

The power converter module 300 may further include a control circuit 340 with control logic 345 for controlling each of the bidirectional switches to set which operating mode that the power converter module 300 is operating in. The operating mode may be selected by the control logic 345 based on predetermined heuristics such as conditions defining when an operating mode should be selected. For example, if the battery cell packages drop below a certain charge while the DC power is available, a charging mode may be selected. Similar rules may be defined for each operating mode. The operating mode may also be selected manually by an administrator. Although depicted as external to the power converter module 300 the control circuit 340 may be also included within the power converter module 300.

Figure 4:
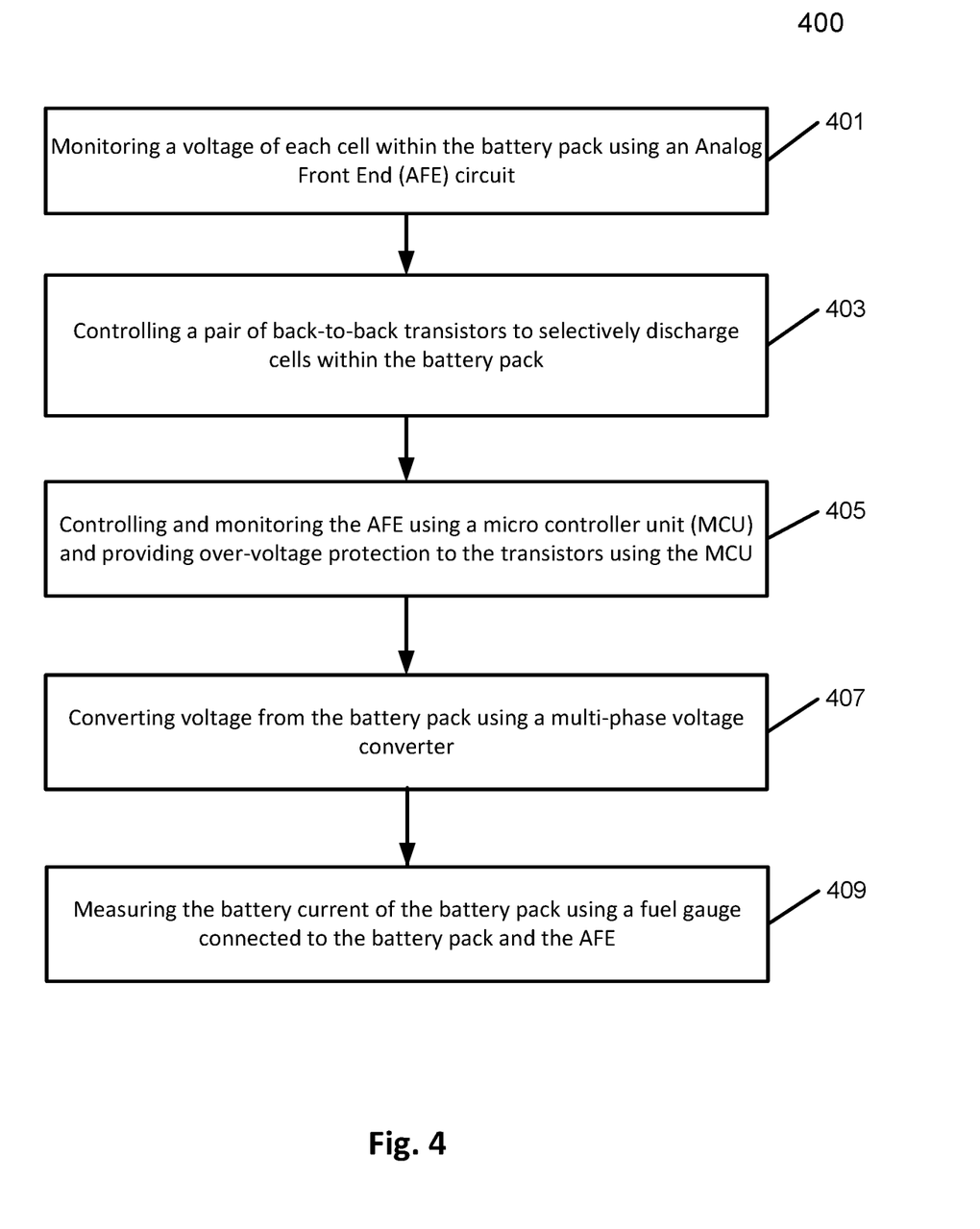
FIG. 4 depicts a flow diagram of a method for controlling a battery management system, according to one embodiment of the disclosure.

FIG. 4 depicts a flow diagram of a method for controlling a battery management system, according to one embodiment of the disclosure. Process 400 may be performed by hardware, software, or a combination thereof. Process 400 may be performed by processing logic of a MCU 115, AFE 109, or some other combination of circuits described in the present disclosure. At operation 401, an AFE circuit monitors a voltage of each cell within a battery pack. As discussed above, the AFE can include an ADC and (optionally) a cell balancing circuit. The AFE can include an individual ADC for voltage monitoring for each cell. It may also have cell balancing circuit for each series of cells.

At operation 403, a pair of back-to-back transistors within the BMS are controlled to selectively discharge cells within the battery pack. In some embodiments, the back-to-back transistors can include a pair of MOSFETs, and a high-side driver is connected to the transistors to control their operation. In some embodiments, a first auxiliary voltage circuit at the battery terminal provides power to the BMS during discharge of the battery pack, while a second auxiliary voltage circuit at the bus-bar terminal provides power to the BMS during standby mode.

At operation 405, a MCU within the BMS controls and monitors the AFE circuit and provides over voltage protection to the back-to-back transistors. In some embodiments, the AFE circuit includes an ADC and a cell balancing circuit.

At operation 407, the voltage from the battery pack can be converted using a multiphase converter. The converter can be used to convert the battery or bus-bar voltage down to the desired auxiliary voltage, such as 5V or 3.3V. Multiple converters can be connected in parallel, in some embodiments, for high power applications. The converter circuit may be any type of converter, such as a four-switch buck-boost type converter or other DC-DC converter. In one embodiment, the converter circuit can include multiple converters coupled in parallel to adjust to DC bus power requirements.

At operation 409, the battery current of the battery pack is measured using a fuel gauge connected with the battery pack and the AFE circuit. The fuel gauge can be connected to a sensing resistor, in some embodiments, to measure the battery current. An independent fuel gauge is optional, in some embodiments, since the MCU can have its own algorithm and I/O for sensing.

Figure 5:
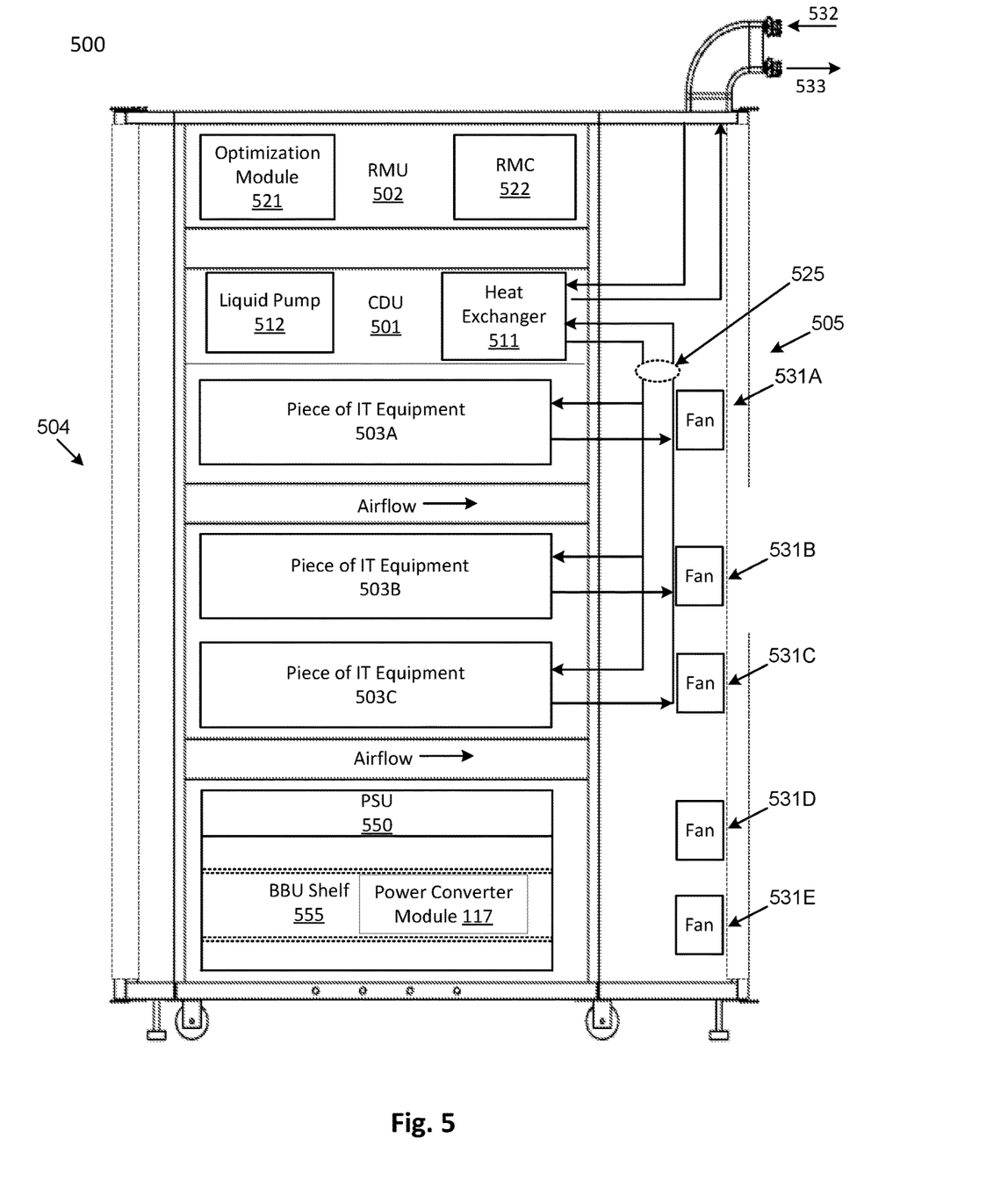
FIG. 5 is an electronic server rack including a battery backup unit with a power converter module having multiple DC buses and multiple battery cell packages and bidirectional charging and discharging capabilities, according to another embodiment of the disclosure.

FIG. 5 is a block diagram illustrating an example of an electronic rack 500 with a BBU shelf 555 according to one embodiment. The BBU shelf 555 may include the power converter module 117 as discussed above. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, the BBU shelf 555, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500. The PSU 550 and/or BBU shelf 555 may be inserted into any of server slots within the electronic rack 500. In one embodiment, the BBU shelf 555 may be inserted into any of the server slots within the electronic rack 500. In another embodiment, the BBU shelf 555 may be inserted into several slots (e.g., taking up two or more slots within the rack). As illustrated, the BBU shelf 555 may be inserted at the bottom (below the PSU 550) of the rack. In one embodiment, along with or in lieu of a BBU shelf, the rack may house one or more BBUs.

In one embodiment, the BBU shelf 555 may include a power converter module 117. The power converter module 117 may be modularly connected or disconnected to the BBU shelf 555. For example, the BBU shelf 555 may include DC bus connections for the power converter module 117 to be connected. Battery cell packages may then be inserted individually to the power converter module 117 in the BBU shelf 555.

Note that although there are only three pieces of IT equipment 503A-503C shown here, more or fewer pieces of IT equipment may be maintained within electronic rack 500. Also note that the particular positions of CDU 501, RMU 502, PSU 550, BBU shelf 555, and IT equipment 503 are shown for the purpose of illustration only; other arrangements or configurations of these components may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 503, and the BBU shelf 555. In this embodiment, fan modules 531A-531E, collectively referred to as fan modules 531, and are associated with the pieces of IT equipment 503A-503D and BBU shelf 555, respectively. Each of the fan modules 531 includes one or more cooling fans. Fan modules 531 may be mounted on the back ends of IT equipment 503 and/or BBU shelf 555 to generate airflows flowing from frontend 504, traveling through the rack 500, and existing at backend 505 of electronic rack 500. In another embodiment, one or more of the fan modules may be positioned on the frontend 504 of the rack 500. Such frontend fans may be configured to push air into the pieces of IT equipment 503 and/or the BBU shelf 555.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or extremal cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. Note that CDUs 501 can be any kind of CDUs commercially available or customized ones. Thus, the details of CDUs 501 will not be described herein.

Each of the pieces of IT equipment 503 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU shelf 555 is configured to provide backup power (e.g., drawing battery energy from one or more BBUs contained therein) to the rack (e.g., one or more pieces of IT equipment 503) when the rack is not drawing power from a main power source, such as during a black out. In one embodiment, operations performed by the controller of the BBU shelf 555 may be performed by any of the components (e.g., IT equipment 503A) within the rack 500 (e.g., selecting operating modes and monitoring sensor data).

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU 550. The PSU 550 may include the necessary circuitry (e.g., an alternating current (AC) to direct current (DC) or DC to DC power converter, backup battery, transformer, or regulator, etc.,) to provide power to the rest of the components of electronic rack 500.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A battery management system, comprising:
a first set of back-to-back transistors configured to selectively discharge battery cells of a battery pack, the first set of back-to-back transistors comprising a first MOSFET and a second MOSFET;
a first high-side driver configured to control an operation of the first set of back-to-back transistors, wherein the first MOSFET is connected to the first high-side driver via a first resistor and the second MOSFET is connected to the first high-side driver via a second resistor;
a second set of back-to-back transistors comprising a third MOSFET and a fourth MOSFET;
a second high-side driver configured to control an operation of the second set of back-to-back transistors, wherein the third MOSFET is connected to the second high-side driver via a third resistor and the fourth MOSFET is connected to the second high-side driver via a fourth resistor;
a first auxiliary power source connected between the second MOSFET of the first set of back-to-back transistors and the third MOSFET of the second set of back-to-back transistors;
a multiphase converter having a first side and a second side, wherein the first side is connected with the fourth MOSFET of the second set of back-to-back transistors;
a second auxiliary power source connected to the second side of the multiphase converter;
an analog front end (AFE) circuit configured to monitor a voltage of each cell within the battery pack; and
a micro controller unit (MCU) configured to control and monitor the AFE circuit, provide over-voltage protection to the first and second sets of back-to-back transistors, and signal the first and second high-side drivers to place the first and second sets of back-to-back transistors in a conducting state when power from the first auxiliary power source is available and power from the second auxiliary power source is unavailable, wherein the MCU is coupled to the first and second high-side drivers.

2. The system of claim 1, wherein the multiphase converter is configured to convert a voltage from the battery pack.

3. The system of claim 2, further comprising an over-voltage protection circuit connected with the battery pack and configured to monitor voltages of the battery cells of the battery pack.

4. The system of claim 2, further comprising a hot-swap circuit connected with the multiphase converter.

5. The system of claim 2, further comprising two or more multiphase converters connected in parallel.

6. The system of claim 1, wherein the first auxiliary power source provides power to the system during discharge of the battery pack, and the second auxiliary power source provides power to the system during a standby mode.

7. The system of claim 1, further comprising a fuel gauge connected with the battery pack and a sensing resistor and configured to measure a current of the battery pack.

8. An electronic rack, comprising:
a stack of server chassis, each server chassis including one or more servers;
a power supply coupled to the server chassis to provide power to the servers;
a battery backup unit (BBU) having a plurality of battery cell packages and each battery cell package containing one or more battery cells, wherein the BBU is configured to provide power to the servers when the power supply is unavailable; and
a battery management system (BMS) connected between the power supply or the servers, the BMS comprising:
a first set of back-to-back transistors configured to selectively discharge the plurality of battery cells of the BBU, the first set of back-to-back transistors comprising a first MOSFET and a second MOSFET;
a first high-side driver configured to control an operation of the first set of back-to-back transistors, wherein the first MOSFET is connected to the first high-side driver via a first resistor and the second MOSFET is connected to the first high-side driver via a second resistor;
a second set of back-to-back transistors comprising a third MOSFET and a fourth MOSFET;
a second high-side driver configured to control an operation of the second set of back-to-back transistors, wherein the third MOSFET is connected to the second high-side driver via a third resistor and the fourth MOSFET is connected to the second high-side driver via a fourth resistor;
a first auxiliary power source connected between the second MOSFET of the first set of back-to-back transistors and the third MOSFET of the second set of back-to-back transistors;
a multiphase converter having a first side and a second side, wherein the first side is connected with the fourth MOSFET of the second set of back-to-back transistors;
a second auxiliary power source connected to the second side of the multiphase converter;
an analog front end (AFE) circuit configured to monitor a voltage of each cell within the BBU; and
a micro controller unit (MCU) configured to control and monitor the AFE circuit, provide over-voltage protection to the first and second sets of back-to-back transistors, and signal the first and second high-side drivers to place the first and second sets of back-to-back transistors in a conducting state when power from the first auxiliary power source is available and power from the second auxiliary power source is unavailable, wherein the MCU is coupled to the first and second high-side drivers.

9. The electronic rack of claim 8, wherein the BMS further comprises a multiphase converter connected with the second set of back-to-back transistors and configured to convert voltage from the BBU.

10. The electronic rack of claim 9, wherein the BMS further comprises an over-voltage protection circuit connected with the BBU and configured to monitor the battery cells of the BBU.

11. The electronic rack of claim 9, wherein the BMS further comprises a hot-swap circuit connected with the multiphase converter.

12. The electronic rack of claim 9, wherein the BMS further comprises two or more multiphase converters connected in parallel.

13. The electronic rack of claim 8, wherein the first auxiliary power source provides power to the BMS during discharge of the BBU, and the second auxiliary power source provides power to the system during standby mode.

14. The electronic rack of claim 8, wherein the BMS further comprises a fuel gauge connected with the BBU and a sensing resistor and configured to measure a current of the BBU.

15. A method of managing a battery pack, the method comprising:
monitoring a voltage of each cell within a battery pack using an analog front end (AFE) circuit within a battery management system (BMS);
controlling first and second sets of back-to-back transistors via first and second high-side drivers within the BMS to selectively discharge cells within the battery pack, the first set of back-to-back transistors comprising a first MOSFET and a second MOSFET and the second set of back-to-back transistors comprising a third MOSFET and a fourth MOSFET with the fourth MOSFET connected to a first side of a multiphase converter, the first MOSFET connected to the first high-side driver via a first resistor, the second MOSFET connected to the first high-side driver via a second resistor, the third MOSFET connected to the second high-side driver via a third resistor, and the fourth MOSFET connected to the second high-side driver via a fourth resistor; and
controlling and monitoring the AFE circuit using a micro controller unit (MCU) within the BMS, wherein the MCU is coupled to the first and second high-side driver and the MCU provides over-voltage protection to the first and second sets of back-to-back transistors
signaling the first and second high-side drivers to place the first and second sets of back-to-back transistors in a conducting state in response to power from a first auxiliary power source being available and power from a second auxiliary power source being unavailable, wherein the first auxiliary power source is connected between the second MOSFET of the first set of back-to-back transistors and the third MOSFET of the second set of back-to-back transistors, the second auxiliary power source is connected to a second side of the multiphase converter.

16. The method of claim 15, further comprising:
providing power to the BMS during discharge of the battery pack using the first auxiliary power source; and providing power to the BMS during standby mode using the second auxiliary power source.

17. The method of claim 15, further comprising:

converting voltage from the battery pack using the multiphase converter.

18. The method of claim 15, further comprising:

measuring battery current of the battery pack using a fuel gauge connected with the battery pack and the AFE circuit.

\* \* \* \* \*